Oct. 31, 1967 H. ROSENBERG 3,350,570

CURRENT DRIVER

Filed Sept. 30, 1963 2 Sheets-Sheet 1

INVENTOR.
HARVEY ROSENBERG
BY Vincent L. Carney
ATTORNEY

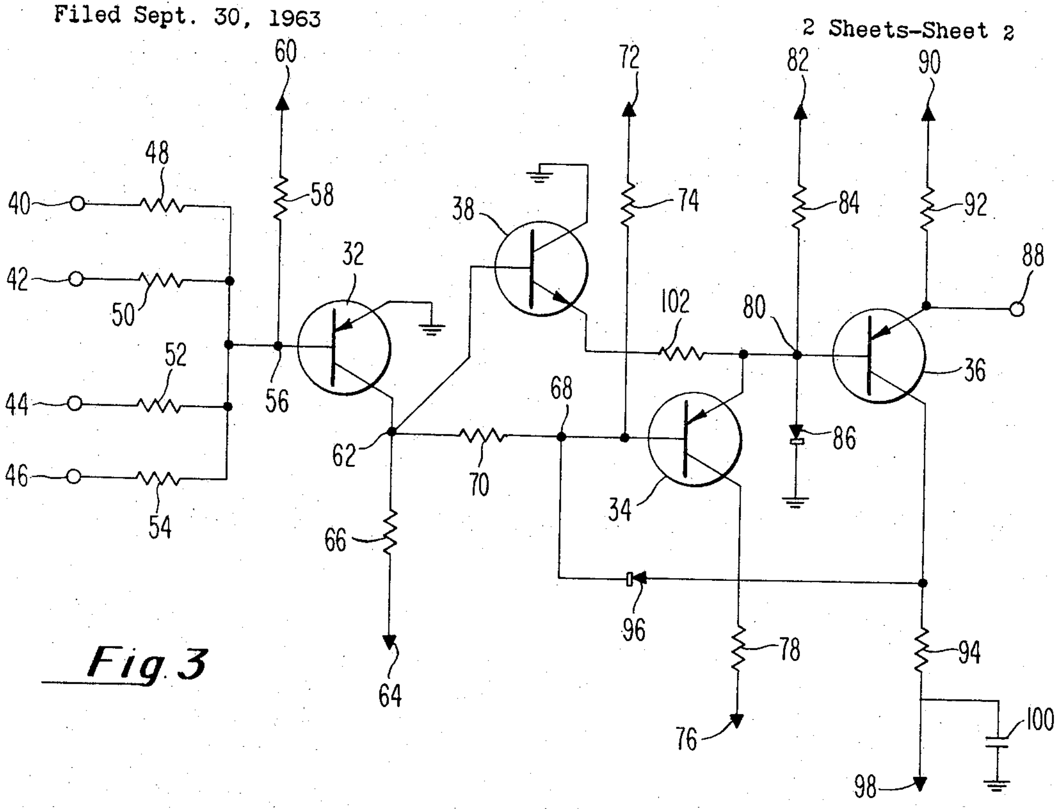
Fig 4
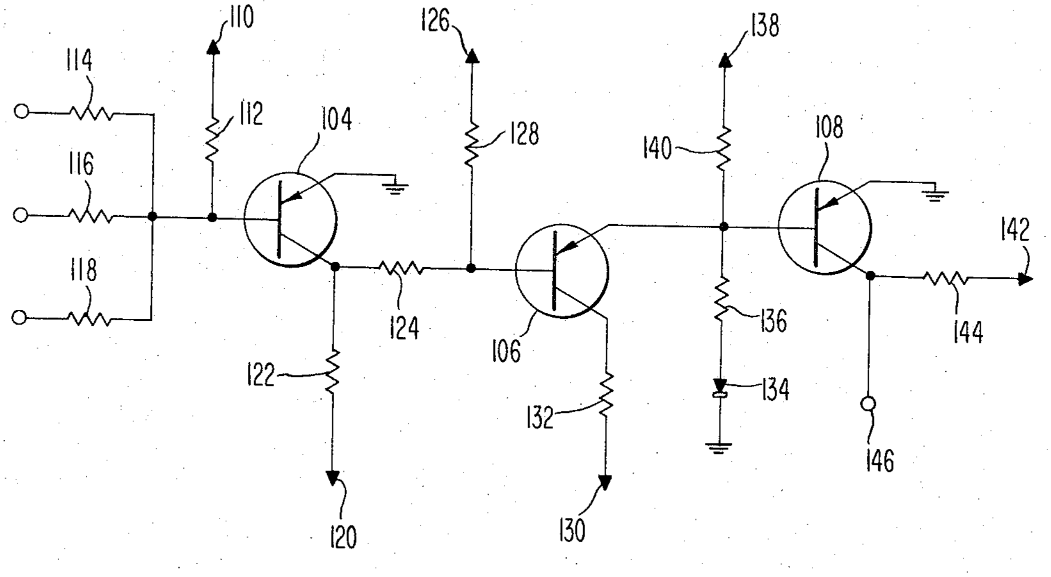
INVENTOR.
HARVEY ROSENBERG
BY Vincent L. Carney
ATTORNEY

United States Patent Office 3,350,570

Patented Oct. 31, 1967

3,350,570

CURRENT DRIVER

Harvey Rosenberg, Huntington Woods, Mich., assignor to Burroughs Corporation, Detroit, Mich., a corporation of Michigan Filed Sept. 30, 1963, Ser. No. 312,575

7 Claims. (Cl. 307—88.5)

This invention relates to semiconductor switching circuits and more particularly to methods and apparatus for increasing the speed of operation of semiconductor switching circuits by removing excess stored charges from the semiconductor elements themselves.

It is frequently desirable to generate pulses of electrical energy for rapidly activating other electrical networks. The circuits which are utilized to generate these electrical pulses are called driver networks, switching networks, or triggers. Semiconductors are commonly used in such circuits.

Frequently these semiconductor driver circuits are required to operate very rapidly. However, the semiconductor elements used in such networks utilize electrons and holes (positive charge carriers) to conduct current. Because these electrons and holes take a finite amount of time to travel through the semiconductors, excess electrons and holes that are injected into the semiconductors while the trigger circuit is conducting tend to keep the trigger circuit in its conducting state after attempts have been made to turn it off (non-conducting). This phenomenon is called hole storage delay.

Accordingly, it is an object of this invention to provide an improved semiconductor driver circuit, which is relatively free from hole storage delay.

It is a further object of this invention to provide a rapidly-operating semiconductor current driver in which holes are removed from the semiconductors when the driving circuits is turned off.

It is a still further object of this invention to provide a method and apparatus for clearing holes from the output transistor of a driver circuit by means of another transistor which is turned on (conducting) by the driver circuit voltages themselves.

In accordance with the above objects, a current driver circuit is provided having an input transistor and an output transistor. A hole clearing transistor is used in conjunction with the input transistor and the output transistor to speed up the turning off of the output transistor so as to provide faster operation of the driver circuit. The hole clearing transistor is biased to cutoff by the output transistor only while the output transistor is off; it is also biased to cutoff by the input transistor while the input transistor is off.

An input pulse to the driver circuit cuts off the input transistor. The input transistor generates a current pulse which drives the output transistor to the "on" state to provide an output from the current driver and at the same time holds the hole-clearing transistor "off." When the input pulse to the driver circuit is terminated, the input transistor turns back on, tending to turn off the output transistor and turning on the hole-clearing transistor.

The output transistor is now held on by the hole storage effect. However, the hole-clearing transistor drives current through the output transistor so as to clear up hole storage and speed up the turn off of the driver circuit. When the output transistor finally turns off, the hole-clearing transistor is biased by it to cutoff and also turns off.

The invention and the above noted and other features thereof will be understood more clearly and fully from the following detailed description with reference to the accompanying drawings in which:

FIG. 3 is a schematic circuit diagram illustrating an embodiment of the invention in greater detail; and FIG. 4 is a schematic diagram of a switch which may be used in conjunction with the invention.

Figure 1:
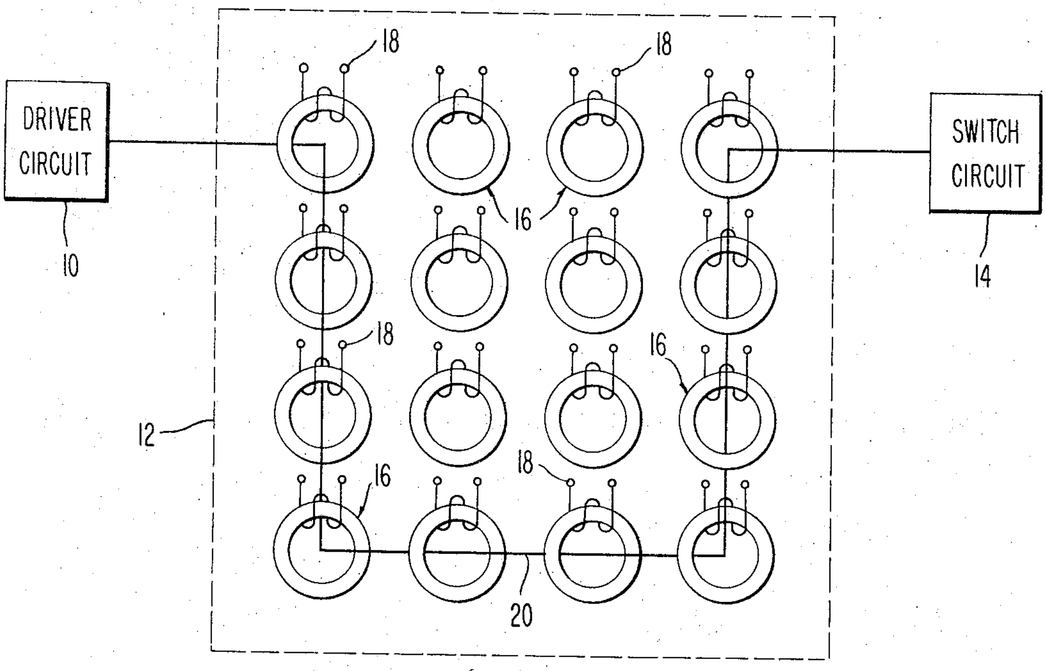
FIG. 1 is a schematic diagram illustrating the use of an embodiment of the invention.

Referring now in particular to FIG. 1, a schematic diagram that illustrates the utility of the invention is shown having a driver circuit 10, a magnetic core matrix shown generally at 12, and a switch circuit 14. The magnetic core matrix 12 includes a plurality of magnetic cores 16 each being normally biased in one direction and each having an output coil 18. An electrical conductor 20 is threaded through some of these cores so as to form a configuration in the shape of the letter U, the shape being of no significance except to serve as an example of an alphanumeric symbol. The conductor 20 is electrically connected at one end to the driver circuit 10 and at the other end of the switch circuit 14. Each of the output windings 18 is electrically connected to a different one of a plurality of styli that together form a printing matrix of an electrostatic printer.

When it is desired to print the letter U with the electrostatic printer, the switch circuit 14 and the driver circuit 10 are activated by voltage pulses. These two circuits cause a high current to flow through conductor 20 and thereby induce a voltage in the output winding 18 of those cores that are threaded by the conductor 20, which cores form the U-shaped configuration. The voltages induced in these windings appear in the styli of the printing matrix of the electrostatic printer so as to print the letter U.

The driver circuit 10, which is an embodiment of the invention, must provide a current of at least 1.6 amperes through a range of 4 to 35 matrix cores. At the same time maximum current may not be so high as to cause excessive charge storage to over-dissipate components or to over-drive the succeeding stages. The leading and trailing edges of the current waveform should be less than 5 microseconds.

Figure 2:
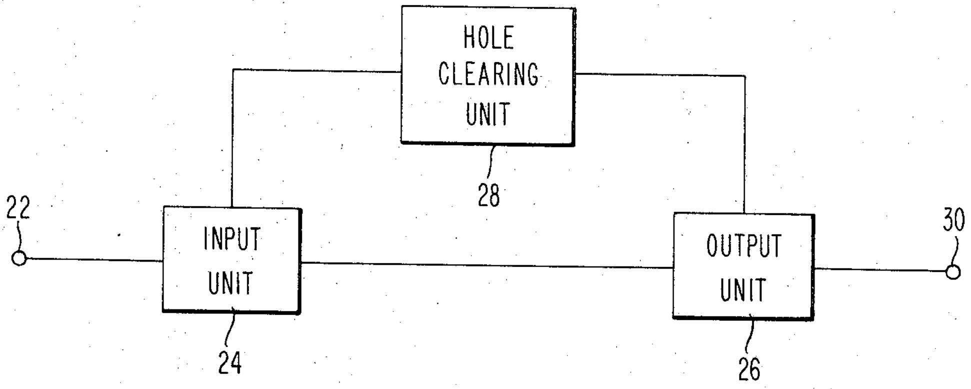
FIG. 2 is a block diagram illustrating an embodiment of the invention.

FIGURE 2 is a block diagram of the driver circuit 10, having an input terminal 22, an input unit 24, an output unit 26, a hole clearing unit 28, and an output terminal 30. The input terminal 22 is electrically connected to the input unit 24 and the output terminal 30 is electrically connected to the output unit 26. The hole clearing unit 28 is electrically connected to both the input unit 24 and the output unit 26. These two units are also electrically connected to each other.

During the time that the driver circuit is inactive the hole clearing unit 28 is held off by the output unit 26 and during the time that the drive circuit has been activated so as to deliver a current pulse the hole clearing unit is held off by the input unit 24. Its function is merely to turn off the output unit 26 after the printing of the letter has taken place. Immediately after selection pulse applied to the input terminal 22 has terminated, the input unit 24 ceases to hold the hold clearing unit 28 inactive. The output unit 26, because it is still delivering current, also fails to hold the hole clearing unit 28 operate to remove the charge from the output unit 26 and to facilitate its turn off.

FIGURE 3 is a schematic circuit diagram of a driver circuit in which the input unit includes transistors 32 and 34, the output unit includes transistor 36, and the hole clearing unit includes transistor 38. The input terminals 40, 42, 44, and 46 are electrically connected to one end of the 3.40K (kilo-ohm) resistors 48, 50, 52 and 54, respectively; the other end of the resistors 48, 50, 52 and 54 are each electrically connected to the terminal 56. Terminal 56 is electrically connected to one end of the 5.62K resistor 58 and also the base of PNP transistor 32. The other end of the resistor 58 is electrically connected to a source of positive 6 volts 60.

The input terminals 40, 42, 44 and 46 have the negative 12 volts applied to them when they are not selected. The selection of an input terminal is made by providing a pulse of a negative 0.5 volt upon the terminal. If any one of the input terminals 40, 42, 44 and 46 is not selected, terminal 56 will have a negative voltage upon it. However, if each of the input terminals receives an input pulse of a negative 0.5 volt, terminal 56 will be driven to a positive value. This will turn on the driver so as to cause the electrostatic printer to print out the letter which the driver controls.

The emitter of the 2N404 transistor 32 is grounded and its collector is connected to a terminal 62. The terminal 62 is electrically connected to the source of negative 18 volts 64 through a 649 ohm resistor 66 and to a terminal 68 through a 604 ohm resistor 70; the terminal 68 is electrically connected to a source of a positive 6 volts 72 through the 2.37K resistor 74 and to the base of the 2N1384 transistor 34. The collector of transistor 34 is electrically connected to the source of a negative 6 volts 76 through the 12.4 ohm resistor 78; its emitter is electrically connected to a terminal 80. The terminal 80 is electrically connected to the source of a positive 6 volts 82 through the 1K resistor 84 and to the anode of diode 86; the cathode of diode 86 is grounded.

If the driver has not been selected or activated, the terminal 56 has a negative potential thereon. This voltage is applied to the base of the PNP transistor 32 in the input circuit of the driver, causing this transistor to conduct, so as to hold the voltage at terminal 62 close to a ground level. The voltage at terminal 62 is applied to the hole clearing unit. It also causes terminal 68 to receive a positive bias from the positive source 72, which divides its voltage between resistors 70 and 74. The positive bias at terminal 68 holds the PNP transistor 34 off. When the transistor 34 is non-conducting, terminal 80 has a potential near ground level due to the action of the clamping diode 86. This potential is applied both to the output unit and to the hole clearing unit.

When a positive voltage appears at terminal 56 of the input unit, indicating that the driver has been selected for print out, the PNP transistor 32 is cut off causing the voltage at terminal 62 to fall from ground potential to a negative value and to remain there until the transistor 32 is switched on again by the termination of the positive pulse at terminal 56. Then it rises again towards a ground level. This negative pulse at terminal 62 is applied to the hole clearing unit and to the base of the PNP transistor 34 of the input unit. The negative pulse turns on the transistor 34 so as to drive the voltage at terminal 80 in the negative direction for the duration of the pulse. The negative pulse at terminal 80 is applied to the output unit and to the hole clearing unit.

The 2N1046A transistor 36 of the output unit has its base connected to terminal 80, has its emitter connected to the source of the positive 6 volts 90 through the 1K resistor 92 and to the output terminal 88, and has its collector connected to the anode of diode 96 and to one end of the 5.9 ohm resistor 94. The other end of the resistor 94 is connected to the source of a negative 18 volts 98 and to one plate of the 100 microfarad capacitor 100; the other plate of capacitor 100 is grounded. The cathode of diode 96 is connected to terminal 68. The transistor 34 of the input unit serves as a valve for controlling the flow of current to the output unit.

When the terminal 80 has a potential close to ground indicating that the driver unit has not been selected, the transistor 36 will conduct very lightly causing a positive output pulse to appear at output terminal 88. When a negative pulse appears at terminal 80 indicating that the driver has been selected, the transistor 36 will conduct heavily drawing approximately 1.6 amperes through the cores. This will cause a negative output pulse to appear at terminal 88. Also the collector of the transistor 36 will become less negative due to the voltage drop across resistor 94. This increase in voltage will be conducted to terminal 68 at the base of transistor 34 when feedback diode 96 becomes forward biased. The feedback prevents transistor 36 from saturating thereby preventing collector hole injection into the base region. This in turn minimizes the stored charge accumulated in transistor 36.

The NPN transistor 38 of the hole clearing unit is of the type 2N388. It has its base connected to terminal 62, its collector grounded, and its emitter connected to terminal 80 through variable resistor 102.

When the driver has not been selected, the NPN transistor 38 of the hole clearing unit which is biased between it base and its emitter by the difference in voltage between terminal 62 of the input unit and terminal 80 of the output unit, is held in the non-conducting state. At this time the base of transistor 38 is held slightly negative by the drop across transistor 32, which is conducting, and the emitter of transistor 38 is held slightly positive by the forward drop across diode 86. When the driver is selected, a negative pulse appears at terminal 62 and at terminal 80 and continues to hold the transistor 38 off. When the selecting voltages to the driver are terminated, the voltage at terminal 62 again rises, but the voltage at terminal 80 remains negative since the output transistor 36 is held on by hole storage. The transistor 38 is now switched on and drives current to the base of the transistor 36, eliminating the storage between the base and the emitter of transistor 36 so as to turn it off sharply. In this manner the required switching speed for the driver circuit may be obtained.

Referring now in particular to FIGURE 4, a schematic circuit diagram of the switch circuit 14 is shown having PNP transistor 104, PNP transistor 106, and PNP transistor 108. The PNP transistor 104 is of the type 2N404. Its emitter is grounded; its base is connected to a source of a positive 6 volts 110 through the resistor 112, and to the three parallel input resistors 114, 116, and 118; and its collector is connected to a source of negative 18 volts 120 through the resistor 122 and to the base of PNP transistor 106 through the resistor 124.

The PNP transistor 106 is of the type 2N1384. Its base is connected to the source of positive 6 volts 126 through resistor 128 and its collector is connected to the source of a negative 6 volts 130 through the resistor 132. The emitter of transistor 106 is connected to the base of transistor 108 and to the anode of diode 134 through resistor 136; the cathode of diode 134 is grounded.

The PNP transistor 107 is of the type 2N665. Its emitter is grounded; its base is connected to a source of positive 6 volts 138 through the resistor 140; and its collector is connected to the source of a negative 6 volts 142 through the resistor 144 and also to output terminal 146.

The switch circuit of FIGURE 4 operates in the same manner as the driver circuit of FIGURE 3 except that it does not utilize a hole clearing unit. This slows down the operation of the circuit. However, this is not harmful since the current flowing through the conductor is also controlled by the driver circuit. If it were desirable to print the letter U, as shown in FIGURE 1, the switch circuit 14 would first be activated, then the driver circuit 10 would be activated. When the driver circuit is activated the current would flow through the condructor 20 to cause the letter U to be printed out. Then the driver circuit would be deactivated. The current would then stop flowing. After this, the switch circuit 14 would be turned off.

To select a switch circuit, input pulses, swinging from a negative 12 volts to a negative 0.5 volt and back to a negative 12 volts are applied to each of the input terminals connected to the input resistors 114, 116 and 118. This turns off the transistor 104 causing a negative pulse to be coupled to the base of transistor 106. Transistor 106 is switched on by this negative pulse so as to drive the base of transistor 108 in a negative direction. This in turn provides a path for the electron flow from the output of the driver circuit to ground when the driver circuit is activated.

It can be seen that the hole clearing unit, as used in the driver circuit, materially speeds up the operation of both the driver circuit and the electrostatic printer. This apparatus enables the output transistor of the driver circuit to provide a large output current and yet be turned off quickly. The use of the hole clearing unit of this invention substantially reduces the hole storage problem in the base-to-emitter junction of the output transistor.

Obviously, many modifications and variations of the present invention are possible in the light of the above teachings. It is therefore to be understood that within the scope of the appended claims the invention may be practiced otherwise than as specifically described.

What is claimed is:

1. The combination comprising:

an input terminal adapted to receive a trigger pulse;

current-limiting impedance means;

semiconductor current-driving means having a control electrode electrically connected to said input terminal through said impedance means for providing a current output pulse upon receiving said trigger pulse;

valve means electrically connected to said input terminal independently of said impedance means, to the control electrode of said semiconductor current-driving means, and to a source of electrical charges for conducting electrical charges between said source and said semiconductor current-driving means while there is no trigger pulse on said input terminal, independently of the voltage applied thereto after said trigger pulse, and said semiconductor current-driving means is providing an output pulse.

2. Apparatus for removing excess charges in a semiconductor driving circuit having an input terminal, a current-limiting input circuit for receiving an input trigger pulse and an output circuit having a control terminal electrically connected to said input circuit for providing an output driving pulse, comprising:

an electric-current valve;

first electrode means, electrically connected to said valve and to the control terminal of the output driving circuit, for conducting said excess charges from said driving circuit into said valve;

second electrode means, electrically connected to said valve and adapted to being connected to a body capable of absorbing said excess charges; and control electrode means, electrically connected directly to said input terminal and to said valve, for holding said valve off while a trigger pulse is present in said input circuit and while said output circuit is providing an output driving pulse and for turning said valve on while there is no trigger pulse in said input circuit and said output circuit is providing an output driving pulse to remove the excess charges injected into said semiconductor driving circuit independently of the voltage applied to said input terminal between input trigger pulses.

3. Apparatus for removing excess charges from a semiconductor driving circuit having an input terminal, a current-limiting input circuit for receiving an input trigger pulse and an output circuit having a control terminal electrically connected to said input circuit for providing an output driving pulse according to claim 4, in which said electric current valve is a semiconductor triode and said input circuit comprises an impedance means.

4. A rapidly operating current driver, comprising:

current limiting input means, having a signal input terminal and an output terminal, for conducting a trigger input pulse to said output terminal;

output driver means, for providing a driving current to a load when receiving a trigger circuit output pulse on a driver input terminal;

trigger means, electrically connected to said output terminal of said input means and to said driver input terminal, for providing said trigger circuit output pulse to said output driver means when receiving a trigger input pulse from said input means; and turn-off means, electrically connected to said input terminal of said input means directly and to said output driver input terminal to cause a current flow at said driver input terminal immediately after the termination of said trigger input pulse independently of said input means and independent of signal polarity reversal on said input terminal after the trigger input pulse.

5. A rapidly operating driver according to claim 4 in which said trigger means is a semiconductor device having a control electrode electrically connected to said input means output terminal, said output driver means comprises semiconductor means having its control electrode electrically connected to said driver input terminal.

6. A rapidly operating current driver according to claim 5 in which said turn-off means comprises a semiconductor triode and further comprising a normally reverse-biased diode electrically connected between the output terminal of said output driver means and the input terminal of said trigger means.

7. A current driver comprising:

a first PNP transistor having its emitter grounded, its base electrically connected to an input terminal, and its collector connected to a source of negative potential through a resistor;

a second PNP transistor having its base electrically connected to the collector of said first PNP transistor and to a source of positive potential through a resistor, having its emitter connected to a source of positive potential through a resistor, and having its collector connected to a source of negative potential through a resistor;

a third PNP transistor having its base electrically connected to the emitter of said second PNP transistor, having its emitter electrically connected to a source of positive potential through a resistor and also to an output terminal, and having its collector connected to a negative source of potential through a resistor;

a first diode having its anode electrically connected to the emitter of said second PNP transistor and having its cathode grounded;

a second diode having its anode electrically connected to the collector of said third PNP transistor and having its cathode electrically connected to the base of said second PNP transistor;

an NPN transistor having its collector grounded, having its base electrically connected to the collector of said first PNP transistor, and having its emitter electrically connected to the base of said third PNP transistor.

References Cited

UNITED STATES PATENTS

| | | | |
|---|---|---|---|
| 3,056,064 | 9/1962 | Bourget | 307—88.5 |
| 3,091,705 | 5/1963 | Levine | 307—88.5 |
| 3,194,979 | 7/1965 | Toy | 307—88.5 |

FOREIGN PATENTS

| | | |
|---|---|---|
| 644,670 | 7/1962 | Canada. |

ARTHUR GAUSS, *Primary Examiner.*

R. H. EPSTEIN, *Assistant Examiner.*